United States Patent
Ma et al.

(10) Patent No.: US 12,108,548 B2
(45) Date of Patent: Oct. 1, 2024

(54) ELECTRONIC DEVICE

(71) Applicant: VIVO MOBILE COMMUNICATION CO., LTD., Dongguan (CN)

(72) Inventors: Yuchun Ma, Dongguan (CN); Lele Li, Dongguan (CN); Junhui Chen, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 278 days.

(21) Appl. No.: 17/727,689

(22) Filed: Apr. 22, 2022

(65) Prior Publication Data

US 2022/0248547 A1 Aug. 4, 2022

Related U.S. Application Data

(63) Continuation of application No. PCT/CN2020/123897, filed on Oct. 27, 2020.

(30) Foreign Application Priority Data

Oct. 31, 2019 (CN) .......................... 201911050916.7

(51) Int. Cl.
*H05K 5/02* (2006.01)
*G01B 21/16* (2006.01)

(52) U.S. Cl.
CPC ........... *H05K 5/0217* (2013.01); *G01B 21/16* (2013.01)

(58) Field of Classification Search
CPC .... H05K 5/0217; H05K 5/0017; G01B 21/16; H04M 1/0237; H04M 1/0274; H04M 1/03; H04M 1/185; H04M 2250/20; H04M 1/0264; H04M 1/236; G06F 1/1671; G06F 1/1656; G06F 1/1686; G06F 1/1684; G05D 3/12
See application file for complete search history.

(56) References Cited

U.S. PATENT DOCUMENTS

2018/0125690 A1 5/2018 Brister et al.

FOREIGN PATENT DOCUMENTS

| CN | 107861616 A | 3/2018 |
|---|---|---|
| CN | 207530918 U | 6/2018 |
| CN | 108491345 A | 9/2018 |
| CN | 108696679 A | 10/2018 |
| CN | 109005264 A | 12/2018 |
| CN | 110307775 A | 10/2019 |
| CN | 110708900 A | 1/2020 |
| CN | 110727210 A | 1/2020 |

(Continued)

OTHER PUBLICATIONS

International Search Report issued in corresponding International Application No. PCT/CN2020/123897, mailed Jan. 28, 2021, 6 pages.

(Continued)

*Primary Examiner* — Anthony Q Edwards
*Assistant Examiner* — Hung Q Dang
(74) *Attorney, Agent, or Firm* — IPX PLLC

(57) ABSTRACT

The present disclosure provides an electronic device, including: a first shell, a driven component, and a first control component, where the first control component is disposed in the first shell or on the driven component, an accommodation hole is formed on the first shell, and the driven component may be retracted into the first shell or may be at least partially protruded from the shell through the accommodation hole.

12 Claims, 3 Drawing Sheets

(56) References Cited

FOREIGN PATENT DOCUMENTS

| | | |
|---|---|---|
| CN | 110764568 A | 2/2020 |
| CN | 110797710 A | 2/2020 |
| CN | 110825168 A | 2/2020 |
| CN | 111314522 A | 6/2020 |
| WO | 03090008 A2 | 10/2003 |
| WO | 2019150960 A1 | 8/2019 |

OTHER PUBLICATIONS

First Office Action issued in related Chinese Application No. 201911050916.7, mailed Jul. 14, 2020, 9 pages.

Second Office Action issued in related Chinese Application No. 201911050916.7, mailed Jan. 28, 2021, 6 pages.

Extended European Search Report issued in related European Application No. 20882722.0, mailed Nov. 24, 2022, 10 pages.

ELECTRONIC DEVICE

CROSS-REFERENCE TO RELATED APPLICATIONS

This application is a continuation of International Application No. PCT/CN2020/123897, filed Oct. 27, 2020, which claims priority to Chinese Patent Application No. 201911050916.7, filed Oct. 31, 2019. The entire contents of each of the above-referenced applications are expressly incorporated herein by reference.

TECHNICAL FIELD

The present disclosure relates to the technical field of electronic devices, and in particular, to an electronic device.

BACKGROUND

Generally, a plurality of first physical controls is disposed on a current electronic device, to implement rapid control on some functions. For example, the first physical controls includes a first power supply control, a first volume up control, or a first volume down control. In actual application, a plurality of accommodation holes may be formed on the electronic device, and each first physical control may be accommodated in the accommodation hole. Therefore, because the plurality of accommodation holes are formed on the current electronic device, the entire strength of the electronic device is poor and appearance unity is poor.

SUMMARY

Embodiments of the present disclosure provide an electronic device, to resolve a problem of relatively low entire strength of the electronic device.

To solve the foregoing technical problem, the present disclosure is implemented as follows:

An embodiment of the present disclosure provides an electronic device, including: a first shell, a driven component, and a first control component, where the first control component is disposed in the first shell or on the driven component, an accommodation hole is formed on the first shell, and the driven component may be retracted into the first shell through the accommodation hole or may be at least partially protruded from the shell;

when the first control component is disposed in the first shell, the first control component is disposed towards a side wall of the driven component, and when the driven component is located in the first shell, the driven component can rotate between a first position and a second position, where when the driven component is in the first position, the first control component is in a first state, or when the driven component is in the second position, the first control component is in a second state; or when the first control component is disposed on a side wall of the driven component, and the driven component is located in the first shell, the driven component can rotate between a first position and a second position, when the driven component is in the first position, the first control component is in a first state, or when the driven component is in the second position, the first control component is in a second state.

In this embodiment of the present disclosure, only one accommodation hole may be disposed on the electronic device, and the first control component may be disposed on the driven component or in the first shell of the electronic device. In this way, a quantity of the accommodation holes formed on the electronic device is reduced, thereby improving entire strength and appearance unity of the electronic device.

DESCRIPTION OF DRAWINGS

To describe the technical solutions in the embodiments of the present disclosure more clearly, the following briefly introduces the accompanying drawings required for describing the embodiments of the present disclosure. Apparently, the accompanying drawings in the following description show merely some embodiments of the present disclosure, and a person of ordinary skill in the art may still derive other drawings from these accompanying drawings without creative efforts.

DETAILED DESCRIPTION

The following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
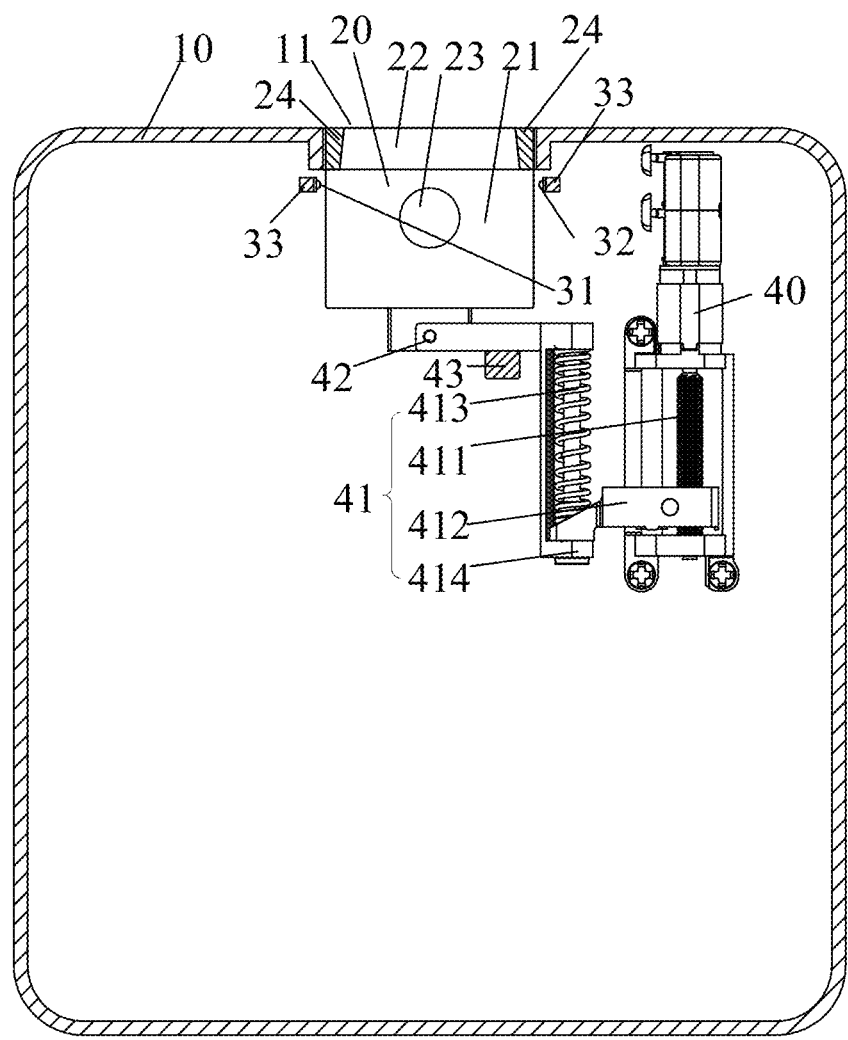
FIG. 1 is a first schematic structural diagram of an electronic device according to an embodiment of the present disclosure.
Figure 2:
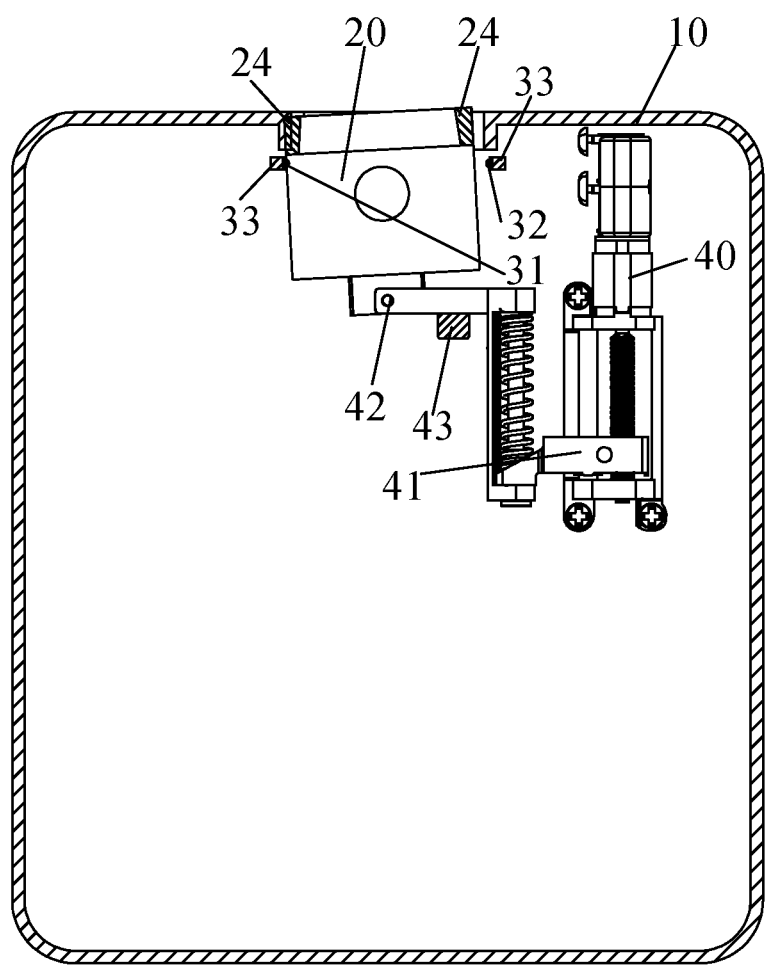
FIG. 2 is a second schematic structural diagram of an electronic device according to an embodiment of the present disclosure.

Referring to FIG. 1 and FIG. 2, an embodiment of the present disclosure provides an electronic device. As shown in FIG. 1, the electronic device includes a first shell 10, a driven component 20, and a first control component 31, where the first control component 31 is disposed in the first shell 10 or on the driven component 20, an accommodation hole 11 is formed on the first shell 10, and the driven component 20 may be retracted into the first shell 10 or may be at least partially protruded from the first shell through the accommodation hole 11.

When the first control component 31 is disposed in the first shell 10, the first control component 31 is disposed towards a side wall of the driven component 20, and when the driven component 20 is located in the first shell 10, the driven component 20 may rotate between a first position and a second position. When the driven component 20 is in the first position, the first control component 31 is in a first state, or when the driven component 20 is in the second position, the first control component 31 is in a second state.

When the first control component 31 is disposed on a side wall of the driven component 20, and the driven component 20 is located in the first shell 10, the driven component 20 may rotate between a first position and a second position. When the driven component 20 is in the first position, the first control component 31 is in a first state, or when the driven component 20 is in the second position, the first control component 31 is in a second state.

For a working principle of this embodiment of the present disclosure, refer to the following description:

When the first control component 31 is located in the first shell 10, a status of the first control component 31 may be determined based on a position relationship between the driven component 20 and the first control component 31. For example, when the driven component 20 is in the first position, there may be a first distance between the driven component 20 and the first control component 31, or the driven component 20 and the first control component 31 may be disposed in a staggered manner. In this way, the first control component 31 may be in the first state. When the driven component 20 is in the second position, there may be a second distance between the driven component 20 and the first control component 31, or the driven component 20 and the first control component 31 may be disposed oppositely. In this way, the first control component 31 may be in the second state.

It should be noted that the first distance may be less than the second distance, or the first distance may be greater than the second distance. For example, when the first distance is less than the second distance, the first distance may be 0. In other words, when the driven component 20 is in the first position, the driven component 20 is in contact with the first control component 31, or when the driven component 20 is in the second position, the driven component 20 is separated from the first control component 31. When the first distance is greater than the second distance, the second distance may be 0. In other words, when the driven component 20 is in the first position, the driven component 20 is separated from the first control component 31, or when the driven component 20 is in the second position, the driven component 20 is in contact with the first control component 31.

When the first control component 31 is disposed on the driven component 20, because the first control component 31 may rotate as the driven component 20, a status of the first control component 31 may be directly determined by using a position of the first control component 31. For example, when the driven component 20 is in the first position, the first control component 31 may be considered as being in the first position, and it may be determined that the first control component 31 is in the first state. When the driven component 20 is in the second position, the first control component 31 may be considered as being in the second position, and it may be determined that the first control component 31 is in the second state.

That the first control component 31 is in the first state may mean that the first control component 31 is in an enabled state, and that the first control component 31 is in the second state may mean that the first control component 31 is in a disabled state. Certainly, that the first control component 31 is in the first state may mean that the first control component 31 is in a state of sending a first control signal, and that the first control component 31 is in the second state may mean that the first control component 31 is in a state of sending a second control signal.

It should be noted that the first state and the second state are different states.

In some embodiments, there may be a third position between the first position and the second position, and when the driven component 20 is in the third position, the first control component 31 may be in either the first state or the second state. For example, when the driven component 20 is in the first position, the first control component 31 is in the first state, or when the driven component 20 is in the second position or the third position, the first control component 31 is in the second state. Alternatively, when the driven component 20 is in the first position or the third position, the first control component 31 is in the first state, or when the driven component 20 is in the second position, the first control component 31 is in the second state. Certainly, the following cases may exist: When the driven component 20 is in the first position, the first control component 31 is in the first state; when the driven component 20 is in the second position, the first control component 31 is in the second state; or when the driven component 20 is in the third position, the first control component 31 is in a fifth state, where the fifth state is different from the first state and the second state. When the driven component 20 is in the third position, the driven component 20 is in a center position of the accommodation hole, that is, an axis of the driven component 20 overlaps with an axis of the accommodation hole.

In some embodiments, the electronic device further includes a second control component 32, and the second control component 32 is disposed in the first shell 10 or on the driven component 20.

When the driven component 20 is in the first position, the second control component 32 is in a third state; or when the driven component 20 is in the second position, the second control component 32 is in a fourth state.

In some embodiments, when the electronic device includes the first control component 31 and the second control component 32, the third position may be further included. When the driven component 20 is in the third position, the first control component 31 may be in either the first state or the second state, and the second control component may be in either the third state or the fourth state. For example, when the driven component 20 is in the first position, the first control component 31 is in the first state, and the second control component 32 is in the third state, or when the driven component 20 is in the second position or the third position, the first control component 31 is in the second state, and the second control component 32 is in the fourth state. Alternatively, when the driven component 20 is in the first position or the third position, the first control component 31 is in the first state, and the second control component 32 is in the third state, or when the driven component 20 is in the second position, the first control component 31 is in the second state, and the second control component 32 is in the fourth state. Certainly, the following cases may exist: When the driven component 20 is in the first position, the first control component 31 is in the first state, and the second control component 32 is in the third state; when the driven component 20 is in the second position, the first control component 31 is in the second state, and the second control component 32 is in the fourth state; and when the driven component 20 is in the third position, the first control component 31 is in a fifth state, and the second control component 32 is in the sixth state, where the fifth state is different from the first state and the second state, and the sixth state is different from the third state and the fourth state. Certainly, specific statuses of the first control component 31 and the second control component 32 at different positions may be set based on needs. For example, when the driven component 20 is in the first position, the first control component 31 is in the first state, and the second control component 32 is in the third state; when the driven component 20 is in the third position, the first control component 31 is in the second state, and the second control component 32 is in the third state; or when the driven component 20 is in the second position, the first control component 31 is in the second state, and the second control component 32 is in the fourth state. Alternatively, when the driven component 20 is in the first position, the first control component 31 is in the first state, and the second control component 32 is in the third state; when the driven component 20 is in the third position, the first control component 31 is in the first state, and the second control component 32 is in the fourth state; or when the driven component 20 is in the second position, the first control component 31 is in the second state, and the second control component 32 is in the fourth state.

When the driven component 20 is in the third position, the driven component 20 is in the center position of the accommodation hole, that is, the axis of the driven component 20 overlaps with the axis of the accommodation hole.

The second control component 32 and the first control component 31 may be of a same type. For example, the second control component 32 and the first control component 31 may be optical sensors. Certainly, the second control component 32 and the first control component 31 may be of different types. For example, the first control component 31 may be an optical sensor, and the second control component 32 may be a distance sensor.

Certainly, control principles used in cases in which when the driven component 20 is in the first position, the second control component 32 is in the third state, and when the driven component 20 is in the second position, the second control component 32 is in the fourth state are similar to principles for the first control component 31. For details, refer to the descriptions of the control principles for the first control component 31, and details are not described herein again.

In addition, the first control component 31 and the second control component 32 may be located in the first shell 10 at the same time, or may be located on the driven component 20 at the same time. Certainly, when the first control component 31 is disposed in the first shell 10, the second control component 32 may be disposed on the driven component 20. Similarly, when the first control component 31 is disposed on the driven component 20, the second control component 32 may be disposed in the first shell 10.

It should be noted that when the first control component 31 and the second control component 32 are located in the first shell 10 at the same time, the first control component 31 and the second control component 32 may be disposed towards a same side wall of the driven component 20. Certainly, the first control component 31 and the second control component 32 may be alternatively disposed towards different side walls of the driven component 20. For example, the first control component 31 may be disposed towards a first side wall of the driven component 20, and the second control component 32 may be disposed towards a second side wall of the driven component 20.

Similarly, when the first control component 31 and the second control component 32 are located on the driven component 20 at the same time, the first control component 31 and the second control component 32 may be located on a same side wall of the driven component 20, or may be located on different side walls of the driven component 20.

The first state and the third state may be different states, and the second state and the fourth state may be different states. For example, the first state may be an enabled state, the second state may be a disabled state, the third state may be the disabled state, and the fourth state may be the enabled state. Alternatively, the first state may be an enabled state, the second state may be a disabled state, the third state may be a state of sending a first control signal, and the fourth state may be a state of sending a second control signal.

Certainly, the first state and the third state may be a same state, and the second state and the fourth state may be a same state. For example, the first state and the third state may be the enabled state, and the second state and the fourth state may be the disabled state; or the first state and the third state may be the disabled state, and the second state and the fourth state may be the enabled state.

In addition, the first control component 31 and the second control component 32 may be respectively electrically connected to different parts, to control the different parts. For example, the first control component 31 may be electrically connected to a first part, and the second control component 32 may be electrically connected to a second part. In this way, when the first control component 31 is in the enabled state, the first control component 31 may control the first part to be enabled, and when the second control component 32 is in the enabled state, the second control component 32 may control the second control component to be enabled.

It should be noted that the first control component 31 and the second control component 32 may be respectively electrically connected to different parts by using a processor of the electronic device.

In addition, when the first control component 31 is in the enabled state, the electronic device performs a first function, and when the second control component 32 is in the enabled state, the electronic device performs a second function. When the first control component 31 and the second control component 32 are in contact with the driven component 20 at the same time (in other words, the first control component 31 and the second control component 32 are in the enabled state or the disabled state at the same time), the electronic device may alternatively perform a third function.

In an implementation of the present disclosure, the electronic device further includes the second control component 32. In this way, the electronic device may control different parts by using the first control component 31 and the second control component 32, to enable more convenient and flexible controlling.

Certainly, in another optional implementation, when the driven component 20 is in the first position, the second control component 32 is in the fourth state; or when the driven component 20 is in the second position, the second control component 32 is in the third state. A difference between this implementation of the present disclosure and the foregoing implementation lies in that when the driven component 20 is in the first position, a status of the second control component 32 is opposite to a status of the second control component 32 in the previous implementation, and when the driven component 20 is in the second position, a status of the second control component 32 is opposite to a status of the second control component 32 in the previous implementation. It should be noted that this implementation and the previous implementation have a same beneficial technical effect, and details are not described herein again.

In some embodiments, when the first control component 31 and the second control component 32 both are located in the first shell 10, the first control component 31 and the second control component 32 are respectively disposed towards two opposite side walls of the driven component 20.

When the first control component 31 and the second control component 32 both are located on the driven component 20, the first control component 31 and the second control component 32 are respectively disposed on two opposite side walls of the driven component 20.

In this implementation of the present disclosure, the first control component 31 and the second control component 32 are respectively disposed towards the two opposite side walls of the driven component 20, or the first control component 31 and the second control component 32 are respectively disposed on the two opposite side walls of the driven component 20. In this way, the first control component 31 and the second control component 32 are disposed separately, to reduce occurrence of interference between the first control component 31 and the second control component 32.

The first shell 10 may be alternatively referred to as a middle frame. In addition, a specific type of the first control component 31 is not limited herein. The first control component 31 may be a pressure button, a metal dome, an optical sensor, a capacitor, an inductor, or the like. For example, the first control component 31 may be a power button. Certainly, the first control component 31 may be a screen capture button. In addition, the first control component 31 may be a volume adjustment control button.

For example, when the first control component 31 is a power button, and the driven component 20 is in the first position, if the first control component 31 is in the enabled state (in other words, the first state is the enabled state), the first control component 31 is in the disabled state (in other words, the second state is the disabled state) when the driven component 20 is in the second position; when the driven component 20 is in the first position, if the first control component 31 is in the disabled state (in other words, the first state is the disabled state), the first control component 31 is in the enabled state (in other words, the second state is the enabled state) when the driven component 20 is in the second position.

It should be noted that the first control component 31 may be electrically connected to the processor of the electronic device. For example, the first control component 31 may be electrically connected to a General Purpose Input/Output (GPIO) port of the processor.

The driven component 20 may adapt to a shape of the accommodation hole 11. For example, the accommodation hole 11 may be a rectangular hole, and a shape of the driven component 20 may also be a rectangle; or the accommodation hole 11 may be a round hole, and a shape of the driven component 20 may also be a round.

In this embodiment of the present disclosure, only one accommodation hole 11 may be disposed on the electronic device, and the first control component 31 may be disposed on the driven component 20 or in the first shell 10 of the electronic device. In this way, a quantity of the accommodation holes 11 formed on the electronic device is reduced, thereby improving entire strength and appearance unity of the electronic device.

Certainly, in another optional embodiment, when the driven component 20 is in the first position, the first control component 31 may be in the second state; or when the driven component 20 is in the second position, the first control component 31 is in the first state. A difference between this embodiment of the present disclosure and the foregoing implementation lies in that when the driven component 20 is in the first position, a status of the first control component 31 is opposite to a status of the first control component 31 in the previous implementation, and when the driven component 20 is in the second position, a status of the first control component 31 is opposite to a status of the first control component 31 in the previous implementation. It should be noted that this embodiment and the previous embodiment have a same beneficial technical effect, and details are not described herein again.

In some embodiments, the first control component 31 is a distance sensor.

When the first control component 31 is disposed in the first shell 10, the distance between the distance sensor and a side wall of the driven component 20 is a first distance when the driven component 20 is in the first position, or the distance between the distance sensor and a side wall of the driven component 20 is a second distance when the driven component 20 is in the second position.

When the distance sensor is disposed on the side wall of the driven component 20, a detection part 50 is disposed in the first shell 10, opposite to the side wall of the driven component 20. When the driven component 20 is in the first position, the distance between the distance sensor and the detection part 50 is a first distance; or when the driven component 20 is in the second position, the distance between the distance sensor and the detection part 50 is a second distance.

The first distance is different from the second distance.

A specific type of the distance sensor is not limited herein. For example, the distance sensor may be an optical sensor or an acoustic wave sensor.

When the first control component 31 is disposed in the first shell 10, the first distance may be greater than the second distance. Certainly, the first distance may be less than the second distance. A relationship between the first distance and the second distance may be determined based on a position relationship between the first position and the second position and a position of the first control component 31. For example, when the first control component 31 is disposed towards the side wall of the driven component 20, and is close to a left side wall of the first shell 10, the first position is close to the left side wall of the first shell 10, and the second position is close to a right side wall of the first shell 10, the first distance is less than the second distance. Correspondingly, when the first position is close to the right side wall of the first shell 10, and the second position is close to the left side wall of the first shell 10, the first distance is greater than the second distance.

Figure 3:
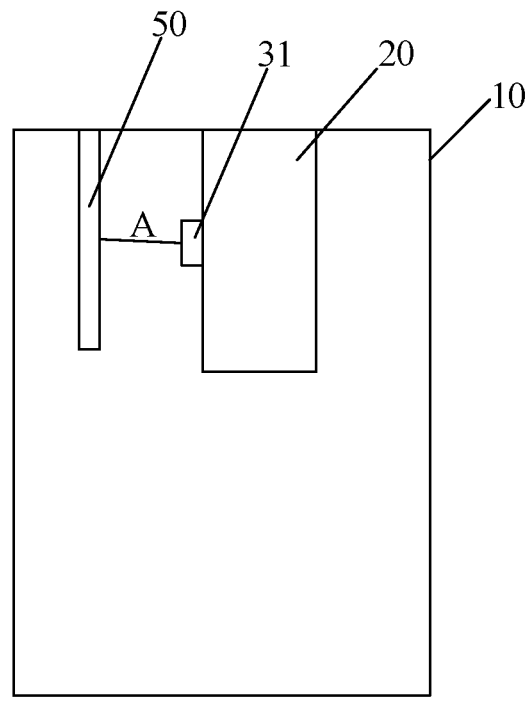
FIG. 3 is a third schematic structural diagram of an electronic device according to an embodiment of the present disclosure.
Figure 4:
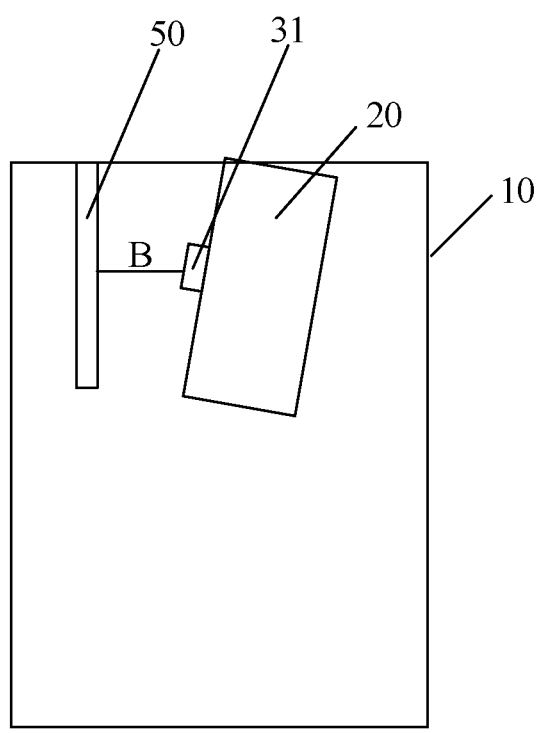
FIG. 4 is a fourth schematic structural diagram of an electronic device according to an embodiment of the present disclosure.

For example, referring to FIG. 3 and FIG. 4, FIG. 3 is a schematic structural diagram showing that the first control component 31 is disposed on the side wall of the driven component 20, and the driven component 20 is in the first position, and FIG. 4 is a schematic structural diagram showing that the first control 31 is disposed on the side wall of the driven component 20, and the driven component 20 is in the second position. A in FIG. 3 represents the first distance, and B in FIG. 4 represents the second distance. It should be noted that the distance between the first control component 31 and the detection part 50 in FIG. 3 and FIG. 4 is the distance between a center position of the first control component 31 and a center position of the detection part 50. It should be noted that when the first control component 31 is disposed towards the side wall of the driven component 20, only the detection part 50 in FIG. 3 and FIG. 4 needs to be replaced with the first control component 31. Correspondingly, there is no need to dispose the first control component 31 on the side wall of the driven component 20.

A specific type of the detection part 50 is not limited herein. For example, the detection part 50 may be a reflection panel, configured to reflect a detection signal sent by the distance sensor. Certainly, the detection part 50 may be alternatively a mounting base fixed in the first shell 10, the mounting base may be used to mount and fix a particular component, and the particular component may be, for example, a sensor.

In addition, when the particular component is a sensor, the sensor may be configured to receive a detection signal sent by the distance sensor, and send a feedback signal for the detection signal to the distance sensor, to further improve the accuracy of detecting the position of the driven component 20.

In this embodiment of the present disclosure, the first control component 31 is the distance sensor. When the distance sensor is located in the first shell 10, the distance sensor detects a distance to the driven component 20, and the first control component 31 may be controlled to be in different states based on different distances. When the distance sensor is disposed on the driven component 20, the distance sensor may detect a distance to the detection part in the first shell 10, and the first control component 31 is controlled to be in different states based on different distances. In this way, different detection manners may be used based on different positions of the first control component 31, to improve flexibility and variety of detection.

In some embodiments, referring to FIG. 1 and FIG. 2, when the first control component 31 is disposed in the first shell 10, the electronic device further includes a mounting base 33 fixedly disposed in the first shell 10, the mounting base 33 is disposed opposite to the side wall of the driven component 20, and the first control component 31 is disposed on a surface of the mounting base 33 towards the side wall of the driven component 20.

A specific type of the mounting base 33 is not limited herein. For example, a shape of the mounting base 33 may be a round or a rectangle, and the mounting base 33 may be made of a metal material or a plastic material.

It should be noted that referring to FIG. 1 and FIG. 2, the second control component 32 may be alternatively disposed on the surface of the mounting base 33 towards the side wall of the driven component 20.

In this embodiment of the present disclosure, because the electronic device further includes the mounting base 33 fixedly disposed in the first shell 10, and the first control component 31 is disposed on the surface of the mounting base 33 towards the side wall of the driven component 20, to improve an effect of fixing the first control component 31.

In some embodiments, referring to FIG. 1, the driven component 20 includes a second shell 21 and a sliding part 22, and the sliding part 22 is disposed on the second shell 21. When the driven component 20 is located in the first shell 10, the sliding part 22 is at least partially exposed from the first shell 10.

The sliding part 22 and the second shell 21 may be fixedly connected, for example, may be adhered by using glue. Certainly, the sliding part 22 and the second shell 21 may be of an integral structure.

In addition, a prompt identifier used to prompt the first control component may be disposed on the sliding part 22, and the prompt identifier may be made by using a silk screen process. For example, when the first control component 31 is a power button, the prompt identifier may be a pattern of a power supply identifier.

Certainly, another control button, for example, a volume adjustment control button or a screen capture button, may be alternatively disposed on the sliding part 22, to better facilitate use of the electronic device.

In addition, the driven component 20 may further include a functional device 23, and the functional device 23 may be embedded into the second shell 21. A specific type of the functional device 23 is not limited herein. For example, the functional device 23 may be a camera module, a strobe light, a telephone receiver, or a Universal Serial Bus (USB) interface. The functional device 23 is the camera module. In this way, there is no need to form an accommodation hole used to accommodate the camera module on a screen of the electronic device, to increase a display area of the screen, and increase a screen-to-body ratio of the electronic device.

In this embodiment of the present disclosure, the driven component 20 includes the sliding part 22, and when the driven component 20 is located in the first shell 10, the sliding part 22 is at least partially exposed to the first shell 10. Therefore, a user can directly identify a position of the sliding part 22, to rapidly identify positions of the second shell 21 and the functional device 23. In addition, the sliding part 22 is disposed, to avoid direct contact between both the second shell 21 and the functional device 23 and the outside, to protect the second shell 21 and the functional device 23.

In some embodiments, when the first control component 31 is disposed in the first shell 10, a first contact part is disposed on the side wall of the driven component 20 towards the first control component 31; and when the driven component 20 is in the first position, the first contact part is not in contact with the first control component 31; or when the driven component 20 is in the second position, the first contact part is in contact with the first control component 31.

A type of the first contact part is not limited herein. For example, the first contact part may be a boss or a rectangular block. When the first contact part is a boss, hardness of the boss may be greater than hardness of the driven component 20. For example, the second shell 21 of the driven component 20 may be made of a plastic material, and the boss may be made of a metal material.

In this embodiment of the present disclosure, the first contact part may be disposed dedicatedly for contact with the first control component 31, to avoid the occurrence of a phenomenon that the driven component 20 or the first control component 31 is destroyed because the driven component 20 directly abuts against the first control component 31. In addition, hardness of the first contact part may be set to be greater than hardness of the second shell 21 of the driven component 20, so that the first contact part is in better contact with the first control component 31, and a contact effect is better.

In some embodiments, when the first control component 31 is disposed on the side wall of the driven component 20, a second contact part is disposed on a side in the first shell 10 opposite to the first control component 31.

When the driven component 20 is in the first position, the second contact part is not in contact with the first control component 31; or when the driven component 20 is in the second position, the second contact part is in contact with the first control component 31.

Alternatively, when the driven component 20 is in the first position, the second contact part is in contact with the first control component 31; or when the driven component 20 is in the second position, the second contact part is not in contact with the first control component 31.

For the second contact part, refer to related descriptions of the first contact part in the previous embodiment, and the second contact part may have a same structure and a same beneficial technical effect as the first contact part. Details are not described herein again.

In this embodiment of the present disclosure, the second contact part may be disposed dedicatedly for contact with the first control component 31, so that the second contact part is in better contact with the first control component 31, to improve an effect of contact between the second contact part and the first control component 31.

In some embodiments, referring to FIG. 1 and FIG. 2, the electronic device further includes an elastic piece 24, and when the driven component 20 is disposed in the first shell 10, the elastic piece 24 is disposed between the sliding part 22 and an inner wall of the accommodation hole 11.

A specific material of the elastic piece 24 is not limited herein. For example, the elastic piece 24 may be rubber or a spring.

In this embodiment of the present disclosure, when the driven component 20 rotates between the first position and the second position, the elastic piece 24 may be disposed between the sliding part 22 and the inner wall of the accommodation hole 11, to reduce impact force exerted by the driven component 20 on the inner wall of the accommodation hole 11, to protect the driven component 20 and the inner wall of the accommodation hole 11.

In some embodiments, the elastic piece 24 is a ring-shaped elastic piece, and the ring-shaped elastic piece is sleeved on the sliding part 22.

In this embodiment of the present disclosure, because the elastic piece 24 is the ring-shaped elastic piece, the ring-shaped elastic piece is in better contact with the inner wall of the accommodation hole 11, so that a protection effect is better. In addition, an effect of fixing the ring-shaped elastic piece and the sliding part 22 is better. In addition, existence of the elastic piece 24 may further enable a water-proof and dust-proof effect.

In another optional implementation, the elastic piece 24 may be embedded into the inner wall of the accommodation hole 11. When the driven component 20 rotates, the elastic piece 24 may be in contact with the sliding part 22 or with the second shell 21 of the driven component 20, to reduce impact force exerted by the driven component 20 on the inner wall of the accommodation hole 11, and further improve an effect of protecting the inner wall of the accommodation hole 11.

In some embodiments, referring to FIG. 1 and FIG. 2, the electronic device further includes a driving mechanism 40 and a transmission parts 41, and the driving mechanism 40 drives, by using the transmission parts 41, the driven component 20 to be retracted into the first shell 10 or be at least partially protruded from the first shell 10 through the accommodation hole 11.

The driving mechanism 40 may be a motor. The transmission parts 41 may include a lead screw 411 and a motor bracket 412. The motor is rotatably connected to the lead screw 411. The motor bracket 412 is sleeved on the lead screw 411, and may slide along the lead screw 411. The motor may drive the lead screw 411 to rotate, to further drive the motor bracket 412 to slide along the lead screw 411, and the motor bracket 412 may be fixedly connected to the driven component 20. In this way, the driven component 20 may be driven to slide along the accommodation hole 11.

Certainly, a spring 413 and a spring bracket 414 may be further disposed between the motor bracket 412 and the driven component 20. In this way, a suspension effect of the driven component 20 can be improved, and an effect of protecting the driven component 20 can be improved.

It should be noted that when the motor rotates, the spring 413 may drive, by using drive force generated by the motor and transmitted by the motor bracket 412, the driven component 20 to be protruded from the first shell 10 or be retracted into the first shell 10 through the accommodation hole 11. The spring bracket 414 is used to support the spring 413. The motor rotates to generate drive force used to drive the driven component 20 to be protruded from the first shell 10 or be retracted into the first shell 10 through the accommodation hole 11. The motor bracket 412 transmits the drive force of the motor to the spring 413.

In addition, a limiting piece 43 used to limit a position of the transmission parts 40 may be further disposed on the electronic device. When the driven component 20 is retracted into the first shell 10, the transmission parts 40 may be in contact with the limiting piece 43. In this way, the driven component 20 may be stopped from being retracted continuously, to play both a limiting function and a positioning function.

In this embodiment of the present disclosure, the electronic device further includes the driving mechanism 40 and the transmission parts 41, and the driving mechanism 40 and the transmission parts 41 are used to drive the driven component 20 to move. In this way, because the dedicated driving mechanism 40 and transmission parts 41 are disposed, an effect of driving the driven component 20 is improved.

In some embodiments, referring to FIG. 1 and FIG. 2, the electronic device further includes a rotating shaft 42, the driven component 20 is rotatably connected to the transmission parts 41 by using the rotating shaft 42, and the driven component 20 rotates around the rotating shaft 42 between the first position and the second position.

It should be noted that after the driven component 20 is retracted, the spring bracket 414 is limited by the limiting piece 43, and cannot move further. In this case, due to elastic force of the elastic piece 24 (a rubber sleeve), the driven component 20 is in a balanced state in a natural state. In this case, when pressure is exerted onto one side, the driven component 20 may overcome the elastic force of the rubber sleeve, and rotate around the rotating shaft 42 to incline to the side receiving the pressure, so that the driven component 20 is in contact with the control (for example, the first control component 31) on this side, to pull down a level of an input/output port (General Purpose Input Output, GPIO) on the processor electrically connected to the control, so that the control is in a corresponding state, and the electronic device performs an operation corresponding to the state. After being released, because the elastic force of the rubber sleeve is restored, the driven component 20 is in the balanced state again.

In this embodiment of the present disclosure, because the driven component 20 is rotatably connected to the transmission parts 41 by using the rotating shaft 42, when the driven component 20 is retracted into the first shell 10, the driven component 20 may further rotate between the first position and the second position under a function of external force, to reduce resistance received by the driven component 20 when the driven component 20 rotates, so that the driven component 20 rotates more conveniently.

In an optional embodiment, the electronic device further includes a hinge, the driven component 20 is rotatably connected to the transmission parts 41 by using the hinge, and the driven component 20 rotates between the first position and the second position around the hinge.

In another optional embodiment, the electronic device further includes a bearing, the driven component 20 is rotatably connected to the transmission parts 41 by using the bearing, and the driven component 20 rotates between the first position and the second position around the bearing.

In this way, two manners of implementing connection by using the hinge and the bearing can implement rotatable connection between the driven component 20 and the transmission parts 41, so that the driven component 20 rotates more conveniently.

The embodiments of the present disclosure are described above with reference to the accompanying drawings, but the present disclosure is not limited to the above specific implementations, and the above specific implementations are only illustrative and not restrictive. Under the enlightenment of the present disclosure, those of ordinary skill in the art can make many forms without departing from the purpose of the present disclosure and the protection scope of the claims, all of which fall within the protection of the present disclosure.

The invention claimed is:

1. An electronic device, comprising: a first shell, a driven component, a first control component, and a second control component different from the first control component, wherein the first control component is disposed in the first shell or on the driven component, the second control component is disposed in the first shell or on the driven component, an accommodation hole is formed on the first shell, and the driven component is configured to retract into the first shell through the accommodation hole or is configured to at least partially protrude from the first shell;
   when the first control component is disposed in the first shell, the first control component is disposed towards a side wall of the driven component, and when the driven component is located in the first shell, the driven component is configured to rotate between a first position and a second position, wherein when the driven component is in the first position, the first control component is in a first state, or when the driven component is in the second position, the first control component is in a second state; or
   when the first control component is disposed on the side wall of the driven component, and the driven component is located in the first shell, the driven component is configured to rotate between a first position and a second position, wherein when the driven component is in the first position, the first control component is in a first state, or when the driven component is in the second position, the first control component is in a second state.

2. The electronic device according to claim 1, wherein the first control component is a distance sensor; and
   when the first control component is disposed in the first shell, a distance between the distance sensor and the side wall of the driven component is a first distance when the driven component is in the first position, or a distance between the distance sensor and the side wall of the driven component is a second distance when the driven component is in the second position; or
   when the distance sensor is disposed on the side wall of the driven component, a detection part is disposed in the first shell, which is opposite to the side wall of the driven component, and when the driven component is in the first position, the distance between the distance sensor and the detection part is a first distance; or when the driven component is in the second position, the distance between the distance sensor and the detection part is a second distance, wherein
   the first distance is different from the second distance.

3. The electronic device according to claim 1, wherein when the first control component is disposed in the first shell, the electronic device further comprises a mounting base fixedly disposed in the first shell, the mounting base is disposed opposite to the side wall of the driven component, and the first control component is disposed on a surface of the mounting base towards the side wall of the driven component.

4. The electronic device according to claim 1, wherein the driven component comprises a second shell and a sliding part, the sliding part is disposed on the second shell, and when the driven component is located in the first shell, the sliding part is at least partially exposed from the first shell.

5. The electronic device according to claim 1, wherein when the first control component is disposed in the first shell, a first contact part is disposed on a side wall of the driven component towards the first control component; and
   when the driven component is in the first position, the first contact part is not in contact with the first control component; or when the driven component is in the second position, the first contact part is in contact with the first control component.

6. The electronic device according to claim 1, wherein when the first control component is disposed on the side wall of the driven component, a second contact part is disposed on a side in the first shell opposite to the first control component; and
   when the driven component is in the first position, the second contact part is not in contact with the first control component, or when the driven component is in the second position, the second contact part is in contact with the first control component; or
   when the driven component is in the first position, the second contact part is in contact with the first control component, or when the driven component is in the second position, the second contact part is not in contact with the first control component.

7. The electronic device according to claim 1,
   wherein when the driven component is in the first position, the second control component is in a third state; or when the driven component is in the second position, the second control component is in a fourth state.

8. The electronic device according to claim 7, wherein when both the first control component and the second control component are located in the first shell, the first control component and the second control component are respectively disposed towards two opposite side walls of the driven component; or
   when the first control component and the second control component are located on the driven component, the first control component and the second control component are respectively located on two opposite side walls of the driven component.

9. The electronic device according to claim 4, further comprising an elastic piece, and when the driven component is located in the first shell, the elastic piece is disposed between the sliding part and an inner wall of the accommodation hole.

10. The electronic device according to claim 9, wherein the elastic piece is a ring-shaped elastic piece, and the ring-shaped elastic piece is sleeved on the sliding part.

11. The electronic device according to claim 1, further comprising a driving mechanism and transmission parts, and the driving mechanism drives, by using the transmission parts, the driven component to be retracted into the first shell or be at least protruded from the first shell through the accommodation hole.

12. The electronic device according to claim 11, further comprising a rotating shaft, the driven component is rotatably connected to the transmission parts by using the rotating shaft, and the driven component rotates around the rotating shaft between the first position and the second position.

* * * * *